United States Patent
Hashimoto et al.

(10) Patent No.: US 6,492,030 B1
(45) Date of Patent: Dec. 10, 2002

(54) THERMOPLASTIC RESIN COMPOSITION HAVING LOW PERMITTIVITY, PREPREG, LAMINATED PLATE AND LAMINATED MATERIAL FOR CIRCUIT USING THE SAME

(75) Inventors: Takeshi Hashimoto, Shizuoka (JP); Masaharu Kobayashi, Shizuoka (JP); Takeshi Sato, Shizuoka (JP); Daisuke Orino, Shizuoka (JP)

(73) Assignee: Tomoegawa Paper Co., Ltd., Tokyo (JP)

( * ) Notice: Subject to any disclaimer, the term of this patent is extended or adjusted under 35 U.S.C. 154(b) by 0 days.

(21) Appl. No.: 09/647,217

(22) PCT Filed: Feb. 1, 2000

(86) PCT No.: PCT/JP00/00537

§ 371 (c)(1), (2), (4) Date: Sep. 28, 2000

(87) PCT Pub. No.: WO00/46816

PCT Pub. Date: Aug. 10, 2000

(30) Foreign Application Priority Data

Feb. 3, 1999 (JP) ............................................ 11-026710
Feb. 3, 1999 (JP) ............................................ 11-026711

(51) Int. Cl.⁷ .............................. B32B 9/04; C08G 73/10
(52) U.S. Cl. ...................... 428/447; 428/448; 428/450; 428/473.5; 528/26; 528/322; 528/310; 526/262; 526/347.1; 525/464
(58) Field of Search ................................ 528/322, 310, 528/26; 526/262, 347.1; 525/423, 421, 432, 436, 464; 428/446, 447, 473.5, 450, 448

(56) References Cited

U.S. PATENT DOCUMENTS

| | | | |
|---|---|---|---|
| 4,543,295 A | 9/1985 | St. Clair et al. | |
| 4,680,220 A | 7/1987 | Johnson | |
| 6,187,874 B1 | * 2/2001 | Yoshioka et al. | ............ 525/421 |
| 6,346,598 B1 | * 2/2002 | Hashimoto et al. | ......... 525/464 |

FOREIGN PATENT DOCUMENTS

| | | |
|---|---|---|
| JP | 57-185350 | 11/1982 |
| JP | 61-83224 | 4/1986 |
| JP | 4-29393 | 1/1992 |
| JP | 4-36366 | 2/1992 |
| JP | 4-41581 | 2/1992 |
| JP | 4-120135 | 4/1992 |
| JP | 8-193139 | 7/1996 |
| JP | 2578097 | 11/1996 |
| JP | 9-25471 | 1/1997 |
| JP | 11-40909 | 2/1999 |

* cited by examiner

Primary Examiner—Robert Dawson
Assistant Examiner—Michael J Feely
(74) Attorney, Agent, or Firm—Nixon & Vanderhye P.C.

(57) ABSTRACT

The present invention relates to a thermosetting low dielectric resin composition, a laminate for use in printed wiring, a laminate for a circuit, and the like. The present invention's thermosetting low dielectric resin composition contains a specific siloxane denatured polyimide, a compound having two or more allyl or methylallyl groups, and a compound having two or more maleimide groups. This resin composition adheres extremely well to metals with a low dielectric constant and low dielectric dissipation factor, and demonstrates very little scattering of the resin during operational processes like punching or cutting. By using laminates or laminates for circuits that employ this resin composition, electrical signals can be propagated more quickly, enabling signals to be processed at faster speeds. In addition, the present invention can be applied to the formation of miniaturized circuit wiring, and is suitably employed in electronic devices employed in the high frequency region, and, in particular, in electronic devices that must be made smaller and lighter in weight.

18 Claims, No Drawings

THERMOPLASTIC RESIN COMPOSITION HAVING LOW PERMITTIVITY, PREPREG, LAMINATED PLATE AND LAMINATED MATERIAL FOR CIRCUIT USING THE SAME

TECHNICAL FIELD

The present invention relates to a thermosetting low dielectric resin composition that adheres extremely well to metals with a low dielectric constant and low dielectric dissipation factor, and for which there is very little scattering of the resin during punching, cutting or other such operational processes. The present invention further relates to a laminate used in printed wiring, a laminate for a circuit, and the like.

This application is based on patent applications filed in Japan (Japanese Patent Application Nos. Hei 11-26710 and Hei 11-26711), the contents of which are incorporated herein by reference.

BACKGROUND ART

Signal speeds and operating frequencies for electronic systems have increased rapidly in recent years. As a result, printed wiring used in electronic systems employed in the high frequency regions have required prepregs and laminates that have excellent thermal resistance and superior adherence properties with a low dielectric constant and low dielectric dissipation factor. In particular, the propagation speed of the electric signal can be increased by employing a laminate consisting of a low dielectric material in the printed wiring. As a result, it has become possible to process signals at a faster speed.

Fluororesins and polyphenylene ether resins that have a small dielectric constant have been proposed as materials for this type of laminate.

However, the reliability of these types of resins is problematic as they have poor workability and adherence properties.

Epoxy denatured polyphenylene ether and polyphenylene ether denatured epoxy have been proposed with the goal of improving workability and adherence properties. However, due to their high dielectric constant, satisfactory properties have not been obtained from epoxy resins.

In addition, thermosetting resin compositions are known (see Japanese Patent Application, First Publication No. (A) Sho 57-185350) that are formed in a pre-reaction by compounding polyphenylene ether resin, multifunctional cyanate ester resin, and another resin, and then adding a radical polymerization initiator. Even in this case, however, the reduction in the dielectric constant is not sufficient.

Furthermore, while a thermosetting polybutadiene resin having as its main component 1,2-polybutadiene has a low dielectric constant, its adherence and thermal resistance properties are not sufficient.

As an example of a low dielectric resin, a composition is known (Japanese Patent Application, First Publication No. (A) Sho 61-83224) in which 5~20 parts by weight of 1,2-polybutadiene resin, 5~10 parts by weight of a bridging monomer, and a radical bridging agent are compounded to 100 parts by weight of a polyphenylene ether resin. However, when employing 1,2-polybutadiene resin having a molecular weight of several thousand, a stickiness remains once the solvent has been removed from the composition. The prepreg obtained by coating and impregnating the composition into fiberglass cannot maintain a tack-free state as a result, making practical application problematic. Moreover, while a method is available that employs high molecular weight 1,2-polybutadiene in order to eliminate the stickiness, solubility in the solvent is reduced. As a result, the solution becomes highly viscous and has poor flow characteristics, so that this too is problematic with respect to practical application.

A low dielectric laminate and copper-clad laminate have been proposed (see Japanese Patent Application (B2) No. 2578097) in which a thermosetting resin is impregnated in a cloth consisting of fluorocarbon fibers. In order to increase the adherence between the fluorocarbon fibers and the thermosetting resin, however, it is necessary to treat the surface of the fluorocarbon fibers. Moreover, fluorocarbon fibers are expensive, so that the final laminate and copper-clad laminate become extremely costly, making this approach impractical.

Multi-layer printed circuit boards that also have electric circuits on their inner layers are used in electronic devices and other equipment. These multi-layer printed circuit boards are obtained by placing an electrically insulating prepreg between an inner layer circuit board, on which circuitry has been formed in advance, and a copper foil, which is employed for the outer layer circuit. Thermocompression molding is then carried out to fabricate a copper-clad laminate that has circuits on its inner layers. Finally, specific circuits are formed to the outer layer of this copper-clad laminate to complete the multi-layer printed circuit board.

A prepreg consisting of epoxy resin and thin glass cloth having a thickness of 30~100 μm has been conventionally employed for the prepreg used here.

However, in the case of this type of prepreg, the cloth weave is readily embossed, while the concavities and convexities of the inner layer circuit board cannot be easily absorbed within the prepreg. As a result, these irregularities readily appear on the surface of the outer layer, impairing the smoothness of the surface and hindering formation of micro wiring.

Accordingly, methods are available in which a resin film that does not contain glass cloth is used as a prepreg in place of the glass cloth epoxy resin prepreg, or in which copper foil attached to a resin base, which already contains a laminated resin base layer that adheres to one side of the copper foil that is used for the outer layer circuit, is employed for both the prepreg and the outer layer circuit.

However, in these types of substitute prepregs, various problems occur when conveying, cutting or laminating the resin film or copper foil attached to a resin base. Namely, resin cracking and deletion may occur; the insulating layer that is between layers may become extremely thin at areas where inner layer circuitry is present during thermocompression molding in the case where employing the prepreg as an insulating material for connecting between the layers in a multi-layer board; the insulation resistance between layers may fall; and shorts may occur. In order to avoid these problems, a resin capable of forming a film is employed for the resin used in this resin film and in the copper foil attached to a resin base.

Various resins with this type of film forming capability have been proposed, including thermoplastic polyimide adhesive film (U.S. Pat. No. 4,543,295), high molecular weight epoxy resin (Japanese Patent Application, First Publication (A) No. Hei 4-120135), acrylonitrile butadiene copolymer/phenol resin (Japanese Patent Application, First Publication (A) No. Hei 4-29393), phenol resin/butyral resin (Japanese Patent Application, First Publication (A) No. Hei 4-36366), and acrylonitrile butadiene copolymer/epoxy resin (Japanese Patent Application, First Publication (A) No. Hei 4-41581), among others.

However, these film-forming resins have poor dielectric constants and cannot process signals at faster speeds.

Furthermore, the low dielectric resin disclosed in the aforementioned Japanese Patent Application, First Publication (A) No. Sho 61-83224 is not reliable with respect to thermal resistance, workability, and adherence, and, moreover, has poor film forming capability. Accordingly, practical application of this resin has not been satisfactory.

DISCLOSURE OF INVENTION

The present invention was conceived to resolve the above-described problems, and has as its objective the provision of a thermosetting low dielectric resin composition for use in printed wiring that adheres extremely well to metals with a low dielectric constant and low dielectric dissipation factor, and for which there is very little scattering of the resin during operational processes. The present invention further relates to a prepreg, laminate, and a laminate for a circuit, that forms a resin film or metal foil attached to a resin base, that employs the aforementioned thermosetting low dielectric resin composition.

The present invention's thermosetting low dielectric resin composition is characterized in the inclusion of a component (a), which is a siloxane denatured polyimide in which the structural unit expressed by the following formula (2a), the structural unit expressed by the following formula (2b), and the structural unit expressed by the following formula (2c) are arrayed; a component (b), which is a compound expressed by the following formula (b-1) or (b-2); and a component (c), which is a compound having two or more maleimide groups.

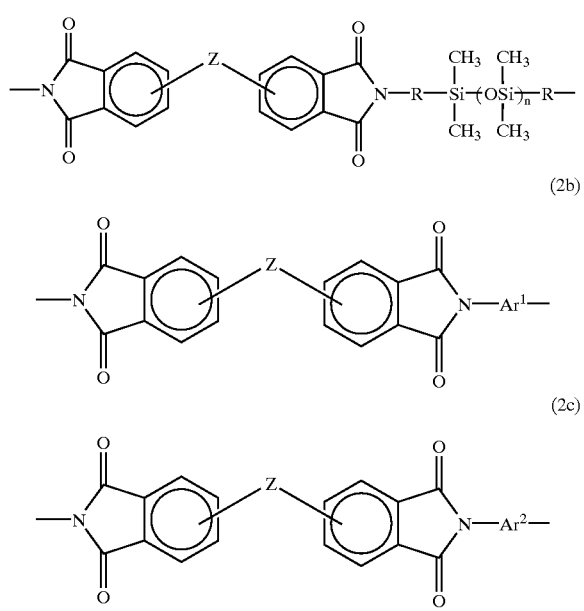

(Where Z indicates a direct coupling, or a —O—, —SO$_2$—, —CO—, —C(CH$_3$)$_2$—, —C(CF$_3$)$_2$—, or —COOCH$_2$CH$_2$OCO— bond; Ar$^1$ indicates a bivalent group having an aromatic ring; Ar$^2$ indicates a bivalent organic group having one or two hydroxyl groups or carboxyl groups; R indicates a 1~10 C alkylene or indicates —CH$_2$OC$_6$H$_4$— of which methylene group is bonded to Si; and n is an integer between 1~20.)

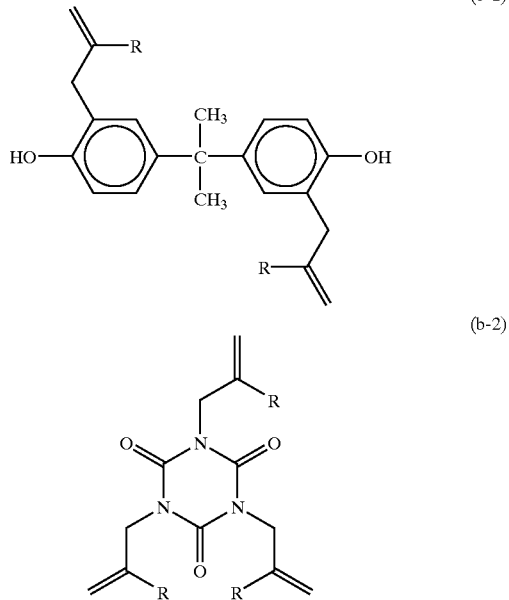

(Where R in the above formulas (b-1) and (b-2) indicates a hydrogen atom or a methyl group.).

The present invention's prepreg is characterized in including the above-described thermosetting low dielectric resin composition and a fiber material.

The present invention's laminate is characterized in that the multiple layers of the prepreg are laminated.

The present invention's laminate for a circuit is characterized in including a resin base layer consisting of a thermosetting low dielectric resin composition and a peelable film or metal layer.

The present invention's thermosetting low dielectric resin composition is superior with respect to its low dielectric constant, thermal resistance, and workability, and is capable of forming a film. Accordingly, the prepreg, laminate, and laminate for a circuit employing this resin composition demonstrate sufficient peel strength at room temperature, and are particularly suitably employed as the laminate material for printed circuit boards.

BEST MODE FOR MARRYING OUT THE INVENTION

The present invention will now be explained in detail.

The present invention's thermosetting low dielectric resin composition is formed of a siloxane denatured polyimide as component (a), a compound having two or more allyl or methylallyl groups as component (b), and a compound having two or more maleimide groups as component (c).

Component (a)

The structural units expressed by formulas (2a), (2b) and (2c) below are arrayed in the siloxane denatured polyimide employed in the present invention.

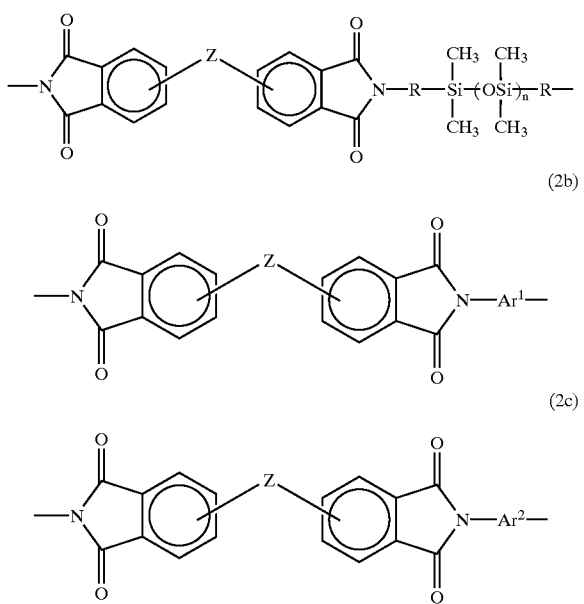

(2a)

(2b)

(2c)

Here, Z indicates a direct coupling, or a —O—, —SO$_2$—, —CO—, —C(CH$_3$)$_2$—, —C(CF$_3$)$_2$—, or —COOCH$_2$CH$_2$OCO—bond. Ar$^1$ indicates a bivalent group having an aromatic ring. Ar$^2$ indicates a bivalent organic group having one or two hydroxyl groups or carboxyl groups. R indicates a 1~10 C alkylene or indicates —CH$_2$OC$_6$H$_4$— of which methylene group is bonded to Si. n is an integer between 1~20.

The array of these various structural units may be regular or irregular.

Groups selected from the chemical group indicated by the following chemical formula are preferable for the Ar$^1$ bivalent group having an aromatic ring. R$^1$, R$^2$, R$^3$ and R$^4$ may be the same or different, and may indicate hydrogen atom, or a 1~4 C alkyl or alkoxy group. However, all of the groups may not simultaneously be hydrogen atoms.

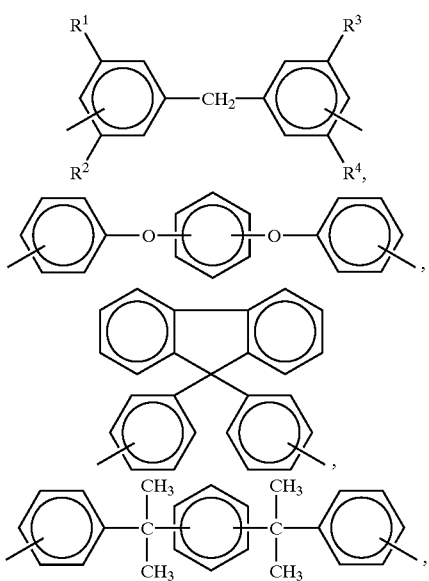

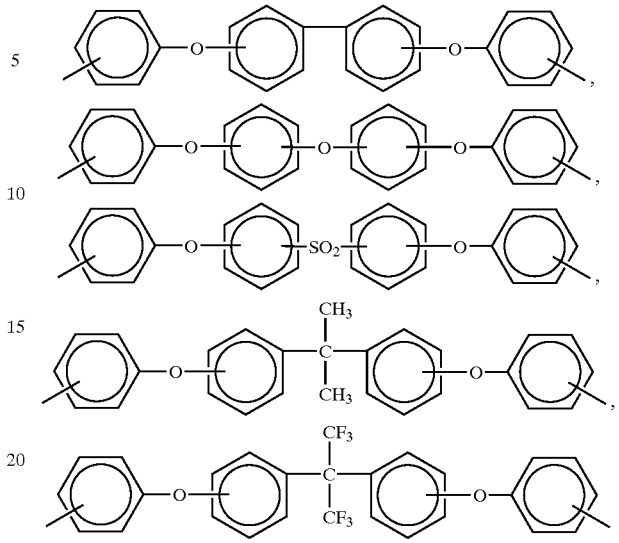

Specific examples may be cited as follows:

4,4'-diamino-3,3', 5,5'-tetramethyldiphenylmethane, 4,4'-diamino-3,3', 5,5'-tetraethyldiphenylmethane, 4,4'-diamino-3,3', 5,5'-tetrapropyldiphenylmethane, 4,4'-diamino-3,3',5,5'-tetraisopropyldiphenylmethane, 4,4'-diamino-3,3',5,5'-tetrabutyldiphenylmethane, 4,4'-diamino-3,3'-diethyl-5,5'-dimethyldiphenylmethane, 4,4'-diamino-3,3'-dimethyldiphenylmethane, 4,4'-diamino-3,3'-diethyldiphenylmethane, 4,4'-diamino-3,3',5,5'-tetramethoxydiphenylmethane, 4,4'-diamino-3,3',5,5'-tetraethoxydiphenylmethane, 4,4'-diamino-3,3'5,5'-tetrapropoxydiphenylmethane, 4,4'-diamino-3,3', 5,5'-tetrabutoxydiphenylmethane, 4,4'-diamino-3,3'-dimethoxydiphenylmethane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 9,9-bis(3-aminophenyl)fluorene, 9,9-bis(4-aminophenyl)fluorene, 1,3-bis[1-(3-aminophenyl)-1-methylethyl]benzene, 1,3-bis[1-(4-aminophenyl)-1-methylethyl]benzene, 1,4-bis[1-(3-aminophenyl)-1-methylethyl]benzene, 1,4-bis[1-(4-aminophenyl)-1-methylethyl]benzene, 3,3'-bis(3-aminophenoxy)biphenyl, 3,3'-bis(4-aminophenoxy)biphenyl, 3,4'-bis(3-aminophenoxy)biphenyl, 3,4'-bis(4-aminophenoxy)biphenyl, 4,4'-bis(3-aminophenoxy)biphenyl, 4,4'-bis(4-aminophenoxy)biphenyl, 3,3'-bis(3-aminophenoxy)diphenylether, 3,3'-bis(4-aminophenoxy)diphenylether, 3,4'-bis(3-aminophenoxy)diphenylether, 3,4'-bis(4-aminophenoxy)diphenylether, 4,4'-bis(3-aminophenoxy)diphenylether, 4,4'-bis(4-aminophenoxy)diphenylether, bis[4-(3-aminophenoxy)phenyl]sulfone, bis[4-(4-aminophenoxy)phenyl]sulfone, 2,2-bis[3-(3-aminophenoxy)phenyl]propane, 2,2-bis[3-(4-aminophenoxy)phenyl]propane, 2,2-bis[4-(3-aminophenoxy)phenyl]propane, 2,2-bis[4-(4-aminophenoxy)phenyl]propane, 2,2-bis[3-(3-aminophenoxy)phenyl]hexafluoropropane, 2,2-bis[3-(4- aminophenoxy)phenyl]hexafluoropropane, 2,2-bis-[4-(3-aminophenoxy)phenyl]hexafluoropropane, 2,2-bis[4-(4-aminophenoxy)phenyl]hexafluoropropane, and the like.

A siloxane denatured polyimide in which the structural unit expressed by the following formula (3a), the structural unit expressed by the following formula (3b), and the structural unit expressed by the following formula (3c) are arrayed is even more preferably employed as the siloxane denatured polyimide of this component (a).

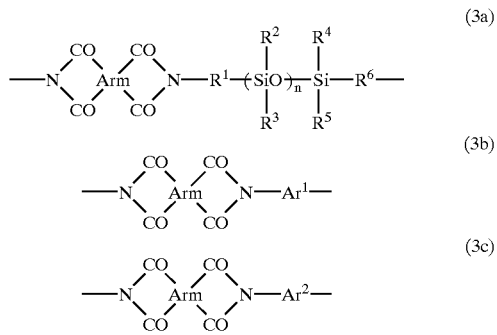

Arm in the above formula is a tetravalent aromatic group and indicates either a 3,3', 4,4'-diphenylsulfone structure, 3,3', 4,4'-biphenyl structure, or 2,3',3,4'-biphenyl structure. $Ar^1$ and $Ar^2$ are identical to the $Ar^1$ and $Ar^2$ in formulas (2b) and (2c). Namely, $Ar^1$ indicates a bivalent group having an aromatic ring and $Ar^2$ indicates a bivalent organic group having one or two hydroxyl groups or carboxyl groups. R indicates a 1~10 C alkylene or indicates —$CH_2OC_6H_4$— of which methylene group is coupled to Si. n is an integer from 1~20.

The ratio between the structural unit expressed by formula (2a) and the total of the structure units expressed by formulas (2b) and (2c) is preferably in a molar ratio range of 5~60:95~40, and more preferably of 15~60:85~40, and even more preferably of 20~50:80~50. If the proportion of the structural unit expressed by formula (2a) is less than 5 molar %, the solubility of the solvent and the effect of reducing the dielectric constant are insufficient. On the other hand, if the proportion of the structural unit expressed by formula (2a) is greater than 60 molar %, then adherence is reduced.

The proportion of the structural unit expressed by formula (2b) and the structural unit expressed by formula (2c) is preferably in a molar ratio range of 1~99:99~1, and even more preferably of 5~95:95~5.

For the siloxane denatured polyimide of component (a), a weight average molecular weight of 5,000~500,000, a glass transition temperature (Tg) of 150° C. or less, and a dielectric constant of 3.0 or less are preferred; a weight average molecular weight in the range of 5,000~300,000, a glass transition temperature of 140° C. or less, and a dielectric constant of 3.0 or less are more preferred; and a weight average molecular weight in the range of 10,000~300,000, a glass transition temperature of 130° C. or less, and a dielectric constant of 3.0 or less are still more preferable. When the weight average molecular weight of the siloxane denatured polyimide is less than 5,000, heat stability deteriorates and thermal resistance falls. On the other hand, when the weight average molecular weight is greater than 500,000, the melt viscosity increases, causing workability and adherence to become poor when employing as a resin composition. When the glass transition temperature exceeds 150° C., the melting temperature increases. As a result, the working temperature increases and the adherence becomes poor. When the dielectric constant exceeds 3.0, it is difficult to reduce the dielectric constant of the resin composition, making application to miniaturizing the inner circuits more difficult.

The siloxane denatured polyimide employed in the present invention can be obtained using a regular method for producing polyimide. Namely, the present invention's siloxane denatured polyimide can be produced from tetracarboxylic acid dianhydride and diamine or diisocyanate applied for each repeating structural unit.

Specifically, the present invention's siloxane denatured polyimide can be produced by reacting a diamine compound having an aromatic diamine for $Ar^1$ and a hydroxyl or carboxyl group for $Ar^2$, and a siloxane compound expressed by the following chemical formula (5), with a tetracarboxylic dianhydride which is pyromellitic dianhydride, 3,3',4,4'-diphenylsulfone tetracarboxylic dianhydride, 3,3',4,4'-benzophenone tetracarboxylic dianhydride, 3,3',4,4'-biphenyl tetracarboxylic dianhydride, 2,3',3,4'-biphenyl tetracarboxylic dianhydride, bis(3,4-dicarboxyphenyl)ether dianhydride, 4,4'-bis(3,4-dicarboxyphenoxy)diphenylsulfone dianhydride, ethylene glycol bis trimellitatic dianhydride, or 2,2-bis[4-(3,4-dicarboxyphenoxy)phenyl]propane dianhydride, or more preferably, is 3,3'4,4'-diphenylsulfone tetracarboxylic dianhydride, 3,3',4,4'-biphenyl tetracarboxylic dianhydride, or 2,3', 3,4'-biphenyl tetracarboxylic dianhydride.

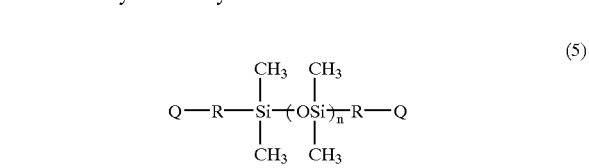

Here, R is a 1~12 C alkylene, and Q is a functional group such as an amino group or isocyanate group.

In the case where the functional group Q is an amino group in the siloxane compound expressed by formula (5) which is employed as a starting material to produce the polyimide, examples of diamines include bis(3-aminopropyl)tetramethyldisiloxane, bis(10-aminodecamethylene)tetramethyldisiloxane, dimethylsiloxane tetramer or octamer at an aminopropyl terminal, bis(3-aminophenoxymethyl)tetramethyldisiloxane and the like. These may also be used in combination.

In the case where the functional group Q is an isocyanate group in the compound expressed by formula (5), examples of isocyanates may be cited by substituting the term "isocyanate" for the term "amino" in the preceding list of diamines.

In the case where the functional group Q is an isocyanate group in the compound expressed by the preceding formula (5), diisocyanates may be readily produced by reacting the diamines cited above with carbonyl chloride according to the usual method.

Examples of diamine compounds having a hydroxyl group or carboxyl group include 2,5-dihydroxy-p-phenylenediamine, 3,3'-dihydroxy-4,4'-diaminodiphenyl ether, 4,3'-dihydroxy-3,4'-diaminodiphenyl ether, 3,3'-dihydroxy-4,4'-diaminobenzophenone, 3,3'-dihydroxy-4,4'-diaminodiphenyl methane, 3,3'-dihydroxy-4,4'-diaminodiphenyl sulfone, 4,4'-dihydroxy-3,3'-diaminodiphenyl sulfone, 2,2'-bis[3-hydroxy-4-(4-aminophenoxy)phenyl]propane, bis[3-hydroxy-4-(4- aminophenoxy)phenyl]methane, 3,3'-dicarboxy-4,4'-diaminodiphenyl ether, 4,3'-dicarboxy-3,4'-diaminodiphenyl ether, 3,3'-dicarboxy-4,4'-diaminobenzophenone, 3,3'-dicarboxy-4,4'-diaminodiphenylmethane, 3,3'-dicarboxy-4,4'-diaminodiphenylsulfone, 4,4'-dicarboxy-3,3'-diaminodiphenylsulfone, 3,3'-dicarboxybenzidine, 2,2'-bis[3-carboxy-4-(4-aminophenoxy)phenyl]propane, bis[3-carboxy-4-(4-aminophenoxy)phenyl]methane, and the like.

Examples of desirable structures for the $Ar^2$ group include phenylene, diphenyl ether, benzophenone, diphenyl methane, diphenyl sulfone, bisphenoxyphenyl propane, bisphenoxyphenyl methane, benzidine, diphenylhexafluoropropane, diphenylbenzene, bisphenoxybenzene, diphenylsulfide, bisphenoxybiphenyl, and 1~12C alkylene structures.

These diamine compounds may be used in combinations of two or more.

An example of the production of the siloxane denatured polyimide employed in the present invention now follows.

When employing tetracarboxylic dianhydride and diamine as the starting materials, there is a method in which the tetracarboxylic dianhydride and the diamine are placed in an organic solvent and heated to 100° C. or more, and preferably 180° C. or more, in the presence of a catalyst (20 parts by weight or less of the reactant) such as tributylamine, triethylamine, or triphenyl phosphite as needed, to directly obtain the polyimide; a method in which tetracarboxylic dianhydride and diamine are reacted in an organic solvent at 100° C. or less to obtain the polyamide precursor, polyamido acid, then a dehydrating catalyst (in a molar quantity that is 1~5 fold that of the tetracarboxylic dianhydride) such as p-toluenesulfonic acid is added as needed, and the polyimide is obtained by carrying out an imidizating reaction by heating; and a method in which this polyamido acid is subjected to chemical cyclization at a relatively low temperature (room temperature~100° C.) following the addition of a dehydrating and cyclizating agent, such as carbodiimide compounds like dicylcohexylcarbodiimide, and acid anhydrides like acetic anhydride, propionic anhydride, or benzoic anhydride, and, as necessary, a cyclizating catalyst such as pyridine, isoquinoline, imidazole, or triethylamine (dehydrating and cyclizating catalysts and cyclizating catalysts are used in a molar amount that is 2~10 fold that of the tetracarboxylic dianhydride).

Examples of the organic solvent employed in the preceding reaction include such aprotic polar solvents as N-methyl-2-pyrrolidone, N,N-dimethylacetoamide, N,N-dimethylformamide, dimethyl sulfoxide, sulfolane, hexamethylphosphoric triamide, 1,3-dimethyl-2-imidazolidone, and the like, and phenol solvents such as phenol, cresol, xylenol, p-chlorophenol, and the like. It is also acceptable to mix into the aforementioned solvent as necessary such compounds as benzene, toluene, xylene, methylethylketone, acetone, tetrahydrofuran, dioxane, monoglyme, diglyme, methylcellosolve, cellosolve acetate, methanol, ethanol, isopropanol, methylene chloride, chloroform, trichloroethylene, nitrobenzene and the like.

In the case where tetracarboxylic dianhydride and diisocyanate are used as the starting materials, it is possible to apply the method described above for directly obtaining the polyimide. The reaction temperature in this case is room temperature or higher, and specifically is 60° C. or higher. By carrying out the reaction between tetracarboxylic dianhydride and the diamine or diisocyanate in equal molar quantities, it is possible to obtain a polyimide with a high degree of polymerization. However, it is also possible to produce the polyimide by using any one of the preceding in an excess amount but within the limits of 10 molar % or less as necessary.

By including this specific siloxane denatured polyimide in the present invention, the flexibility of the molded article comprised of this resin composition is improved, scattering of the resin during such operations as punching or cutting is extremely reduced, and the handling and yield when making a printed circuit board are improved. In addition, because the polyimide is denatured in siloxane, solubility in the solvent is improved. Further, low dielectric properties result, such that a dielectric constant of 3.0 or less is readily possible.

Component (b)

From the perspective of the cured resin composition's thermal resistance and dielectric constant properties, compounds expressed by the following formulas (b-1) and (b-2) are particularly desirable for employment as the compound having two or more allyl or methylallyl groups. These compounds are typically commercially available and can be easily obtained.

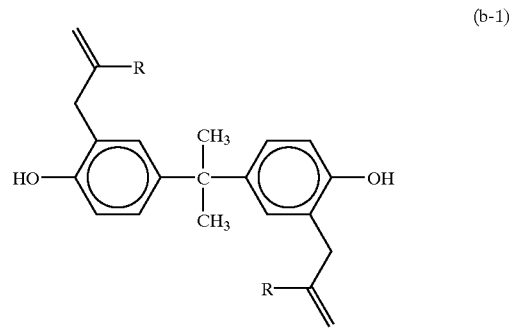

(b-1)

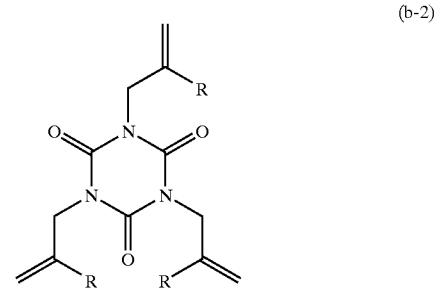

(b-2)

(Where R is a hydrogen atom or a methyl group.) It is particularly desirable that R in formula (b-1) represent a methyl group.

Component (c)

Any compound may be employed for the compound having two or more maleimide groups. From the perspective of electrical reliability, solvent solubility and the like, however, the compounds expressed by the following formulas (c-1) through (c-5) are particularly desirable. These compounds are typically commercially available and can be readily acquired. They can also be synthesized by a known conventional method.

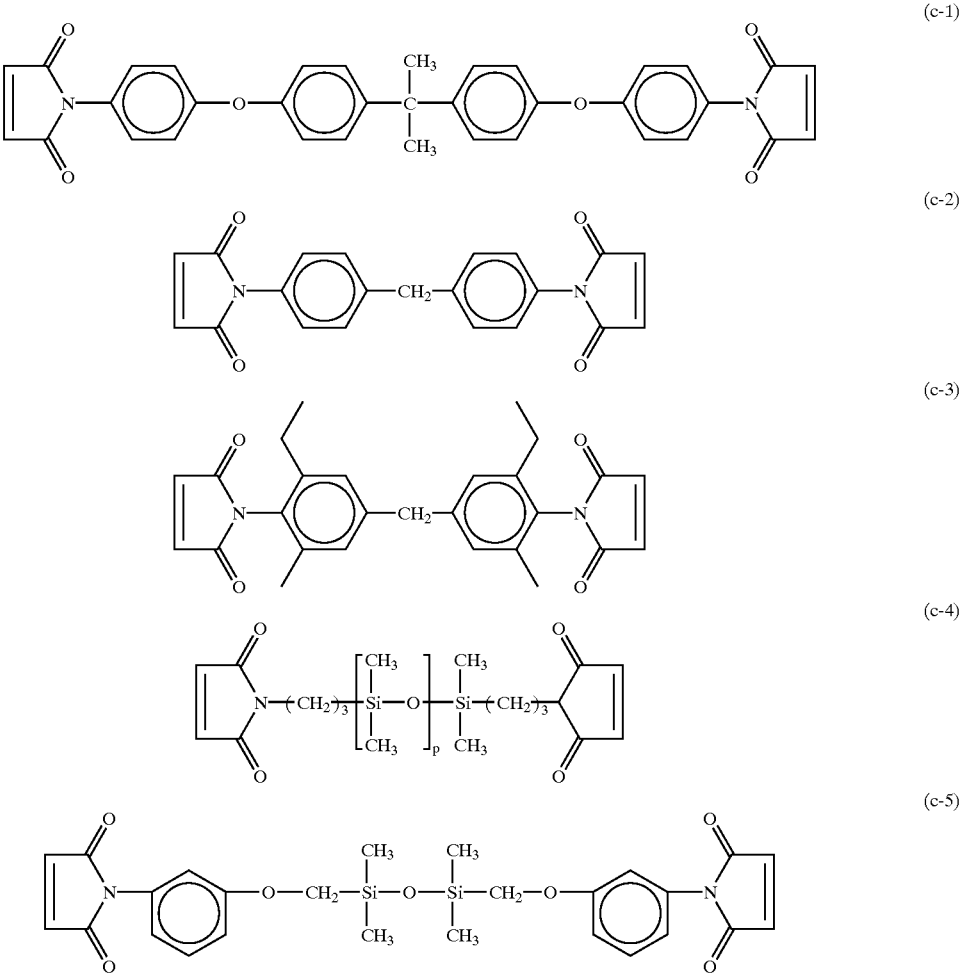

(Where p in formula (c-4) indicates an integer from 1~8.)

The compounding ratio of the preceding components (a)~(c) in the present invention's thermosetting low dielectric resin composition is such that the total of components (b) and (c) is in the range of 10~900 parts by weight with respect to 100 parts by weight of component (a). However, a range of 50~900 parts by weight is preferred, while a range of 100~900 parts by weight is even more preferred. When the total of components (b) and (c) is less than 10 parts by weight, the cured resin composition experiences a marked reduction in thermal resistance, and in its glass transition temperature (Tg) and Young's modulus in particular. As a result, the resin composition cannot be employed for the intended applications. On the other hand, when the total of components (b) and (c) exceeds 900 parts by weight, the resin composition becomes brittle and leads to scattering when the resin has been semi-cured.

With regard to the compounding ratio of component (b) and component (c), it is desirable that the methylallyl groups in component (b) be in the range of 0.1~2.0 molar weight equivalents with respect to 1 molar weight equivalent of the maleimide groups in component (c), with a range of 0.3~1.8 molar weight equivalents being preferred, and a range of 0.5~1.5 molar weight equivalents being even more preferred. When the weight equivalent of the allyl group or methylallyl group becomes less than 0.1 molar weight equivalents, the resin composition has poor electrical reliability following curing. On the other hand, when the weight equivalent of the allyl group or methylallyl group exceeds 2.0 molar weight equivalents, gelling occurs during mixing, so that an adhesive agent cannot be formulated.

The mixing of component (a), component (b) and component (c) may be performed in a solvent that will dissolve these components. Examples of such a solvent include N-methyl-2-pyrrolidone, N,N-dimethyl acetoamide, N,N-dimethyl formamide, dimethyl sulfoxide, sulfolane, hexamethylphosphoric triamide, 1,3-dimethyl-2-imidazolidone, hexane, benzene, toluene, xylene, methylethylketone, acetone, diethylether, tetrahydrofuran, dioxane, 1,2-dimethoxymethane, diethyleneglycol dimethylether, methyl cellosolve, cellosolve acetate, methanol, ethanol, propanol, isopropanol, methyl acetate, ethyl acetate, acetonitrile, methylene chloride, chloroform, carbon tetrachloride, chlorobenzene, dichlorobenzene, dichloroethane, trichloroethane, and the like. The type and quantity of the solvent may be suitably selected from among these so that each component dissolves.

As needed, reaction accelerators for promoting the reaction during drying or heat curing may be added to the thermosetting low dielectric resin composition, examples including diazabicyclo-octane; such organic peroxides as methylethylketone peroxide, cyclohexane peroxide, 3,3,5-trimethylcyclohexanone peroxide, methylcyclohexanone peroxide, methyl acetoacetate peroxide, acetylacetone peroxide, 1,1-bis(t-butyl peroxy)-3,3,5 trimethylhexane, 1,1-bis(t-butyl peroxy)-cyclohexane, 2,2-bis(t-butyl peroxy) octane, n-butyl-4,4-bis(t-butyl peroxy)valerate, 2,2-bis(t-butyl peroxy)butane, t-butyl hydroperoxide, cumene hydroperoxide, diisopropylbenzene hydroperoxide, p-menthane hydroperoxide, 2,5-dimethylhexane-2,5-dihydroperoxide, 1,1,3,3-tetramethylbutyl hydroperoxide, di-t-butylperoxide, t-butylcumyl peroxide, dicumyl peroxide, α,α'-bis(t-butylperoxy-m-isopropyl)benzene, 2,5-dimethyl-2,5-di(t-butylperoxy)hexane, 2,5-dimethyl-2,5-di(t-butylperoxy)hexyne, acetyl peroxide, isobutyl peroxide, octanoyl peroxide, decanoyl peroxide, benzoyl peroxide, lauroyl peroxide, 3,5,5-trimethylhexanoyl peroxide, succinic acid peroxide, 2,4-dichlorobenzoyl peroxide, m-toluoyl peroxide, di-isopropyl peroxydicarbonate, di-2-ethylhexylperoxydicarbonate, di-n-propylperoxydicarbonate, bis-(4-t-butylcyclohexyl) peroxydicarbonate, di-myristylperoxydicarbonate, di-2-ethoxyethyl peroxydicarbonate, di-methoxyisopropylperoxydicarbonate, di(3-methyl-3-methoxybutyl)peroxydicarbonate, di-allylperoxydicarbonate, t-butylperoxyacetate, t-butylperoxyisobutyrate, t-butylperoxypivalate, t-butylperoxyneodecanate, cumyl peroxyneodecanate, t-butylperoxy-2-ethylhexanate, t-butylperoxy-3,5,5-trimethylhexanate, t-butylperoxylaurate, t-butylperoxybenzoate, di-t-butylperoxyisophthalate, 2,5-dimethyl-2,5-di(benzoyl peroxy)hexane, t-butylperoxymaleic acid, t-butylperoxyisopropyl carbonate, cumyl peroxyoctate, t-hexylperoxyneodecanate, t-hexylperoxypivalate, t-butylperoxyneohexanate, acetyl cyclohexylsulfonyl peroxide, and t-butylperoxyallylcarbonate; imidazoles such as 1,2-dimethylimidazole, 1-methyl-2-ethylimidazole, 2-methylimidazole, 2-ethyl-4-methylimidazole, 2-undecylimidazole, 2-heptadecylimidazole, 2-phenylimidazole,. 1-benzyl-2-methylimidazole, 1-benzyl-2-phenylimidazole, 1-benzyl-2-phenylimidazole trimellitate, 1-benzyl-2-ethylimidazole, 1-benzyl-2-ethyl-5-methylimidazole, 2-ethylimidazole, 2-isopropylimidazole, 2-phenyl-4-benzylimidazole, 1-cyanoethyl-2-methylimidazole, 1-cyanoethyl-2-ethyl-4-methylimidazole, 1-cyanoethyl-2-undecylimidazole, 1-cyanoethyl-2-isopropylimidazole, 1-cyanoethyl-2-phenylimidazole, 1-cyanoethyl-2-methylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-ethyl-4-methylimidazolyl-(1')]-ethyl-s-triazine, 2,4-diamino-6-[2'-undecylimidazolyl-(1')]-ethyl-s-triazine, 2-methylimidazolium isocyanurate adduct, 2-phenylimidazolium isocyanurate adduct, 2,4-diamino-6-[2'-methylimidazoyl-(1')]-ethyl-s-triazine-isocyanurate adduct, 2-phenyl-4,5-dihydroxymethylimidazole, 2-phenyl-4-benzyl-5-hydroxymethylimidazole, 4,4'-methylene-bis-(2-ethyl-5-methylimidazole), 1-aminoethyl-2-methylimidazole, 1-cyanoethyl-2-phenyl-4,5-di (cyanoethyoxymethyl)imidazole, 1-dodecyl-2-methyl-3-benzylimidazolium chloride, 2-methylimidazole benzotriazole adduct, 1-aminoethyl-2-ethylimidazole, 1-(cyanoethylaminoethyl)-2-methylimidazole, N,N'-[2-methyimidazolyl-(1)-ethyl]-adipoyldiamide, N,N'-bis-(2-methylimidazoyl-1-ethyl)urea, N-(2-methyimidazoyl-1-ethyl)urea, N,N'-[2-methylimidazoyl-(1)-ethyl]dodecane dioyl diamide, N,N'-[2-methylimidazoyl-(1)-ethyl]eicosane dioyl diamide, 1-benzyl-2-phenylimidazole hydrochloride; and triphenylphosphine.

It is also acceptable to add a silane coupling agent to the thermosetting low dielectric resin composition.

Furthermore, it is preferable to include filler having a particle diameter of 1 μm or less in the thermosetting low dielectric resin composition for the purpose of stabilizing the flow properties of the composition. The amount of filler included is in the range of 5~70 wt %, preferably 10~60 wt %, and even more preferably 20~50 wt %, as a solid component. When the amount of filler included is less than 5 wt %, the effect of stabilizing the flow properties is reduced, while when the amount of filler included exceeds 70 wt %, the adhesive strength of the laminate falls and the dielectric constant increases. Examples of suitable fillers include silica, quartz powder, alumina, calcium carbonate, magnesium oxide, diamond powder, mica, fluororesin, zircon powder and the like.

Prepreg, Laminate, Metal-clad Laminate

The present invention's prepreg includes the above-described resin composition and a fiber material. This prepreg can be fabricated by forming a varnish by dissolving the present invention's thermosetting low dielectric resin composition in the aforementioned organic solvent, coating this varnish onto the fiber material to impregnate it, and then drying. It is preferable that the amount of resin composition following drying is such that it fills the spaces in the fiber material. In addition, the resin composition can also be semi-cured to form a film, and then pressed together with the fiber material in a thermal press to form the prepreg.

A thermal resistant fiber is preferably employed as the fiber material, with specific examples including carbon fiber, glass fiber, aramid fiber, aromatic polyester fiber, boron fiber, silica fiber, tetrafluorocarbon fiber, and the like. These fibers may be used alone or in combinations of two or more, with aramid fiber, aromatic polyester fiber and tetrafluorocarbon fiber being particularly desirable. The fibers may be long or short, and may be used in the form of a woven or unwoven cloth.

The thickness of this type of woven or unwoven cloth is preferably 0.05~1 mm, more preferably 0.1~0.5 mm, and even more preferably 0.1~0.2 mm. If the woven or unwoven cloth is too thin, then the cloth is not sufficiently strong, while if the woven or unwoven cloth is too thick, it becomes difficult to coat and impregnate the cloth with the resin composition varnish.

The present invention's laminate can be obtained by laminating two or more of these prepregs.

The surface of the prepreg or laminate may be made smooth by using a thermal laminator or calender.

A metal-clad laminate can be fabricated by forming a metal layer consisting of metallic foil or the like to one or both surfaces of the laminate. A metal foil having a thickness of 5 μm~200 μm and consisting of copper, cupronickel, silver, iron, 42 alloy, stainless steel, or the like, is suitable as the metal layer used.

In order to fabricate a metal-clad laminate in which metal foil is laminated in a unitary manner to one or both surfaces of a laminate in which a fiber material is filled with the aforementioned thermosetting low dielectric resin composition in the semi-cured form, a press machine, vacuum press, thermal laminator or the like may be employed to laminate the metal foil to one or both sides of the laminate filled with the semi-cured resin composition.

In order to fabricate a metal-clad laminate in which metal foil is laminated in a unitary manner to one or both surfaces of a laminate in which a fiber material is filled with the aforementioned thermosetting low dielectric resin composition in the cured form, metal foil and a laminate, in which the fiber material is filled with semi-cured thermosetting low dielectric resin composition, can be thermally pressed to form a laminated unitary structure.

Note that a peelable protective film may be provided to the surface of these laminates, suitable examples of this protective film including polypropylene film, fluororesin film, polyethylene film, polyethylene terephthalate film, and paper, as well as materials which have been made peelable through the addition of a silicon resin or the like.

It is preferred that these peelable films have a 90° peel strength that is in the range of 0.01~10.0 g/cm. When the peel strength is less than 0.01 g/cm, then the peelable film readily peels off the laminate and either side of the metal-clad laminate during conveyance. When the peel strength is greater than 10.0 g/cm, then it is not possible to cleanly remove the peelable film from the laminate and either side of the metal-clad laminate, so that operability is impaired.

The dielectric constant of the resin composition following curing of the thus-obtained low dielectric thermosetting resin composition, laminate, etc. is preferably 3.2 or less, and even more preferably 3.0 or less. If the dielectric constant is 3.2 or less, then the resin composition can be suitably applied to miniaturization of the inner circuit.

The metal layer of the above-described metal-clad laminate may be subjected to the usual treatments, such as etching, to produce various types of specific print circuit boards.

Laminate for Circuit (Resin Film, Metal Foil Attached to Resin Base)

The present invention's laminate for a circuit requires a resin base layer consisting of the above-described thermosetting low dielectric resin composition.

A resin film or metal foil attached to a resin base, which are one arrangement for the present invention's laminate for a circuit, have a resin base layer and a peelable film or metal layer.

In a resin film having a resin base layer and a peelable film, the peelable film, which functions as a temporary supporting member, protects the resin base layer during distribution and the like, and is removed at the time of use. Suitable examples of this peelable film include polypropylene film, fluororesin film, polyethylene film, polyethylene terephthalate film, and paper, as well as materials which have been made peelable through the addition of a silicon resin or the like. The thickness of the peelable film is preferably 1~200 $\mu$m, and more preferably, 10~100 $\mu$m. It is desirable that these peelable films have a 90° peel strength that is in the range of 0.01~7.0 g/cm. A peel strength of less than 0.01 g/cm is problematic as the peelable film readily peels off during conveyance. On the other hand, when the peel strength is greater than 7.0 g/cm, then it is not possible to cleanly remove the peelable film from the resin base layer, so that operability is impaired.

The resin film may have other layers in addition to the resin base layer and the peelable film. In this case, the other layer may be interposed between the resin base layer and the peelable film. A layer consisting of an adhesive agent of a different composition is suitable as an example of this type of other layer. However, it is desirable to directly for the peelable film onto the resin base layer, so that the resin base layer and the peelable film are next to one another, as a circuit laminate having a lower dielectric constant results.

The metal layer in the metal foil which is attached to a resin base that has a resin base layer and a metal layer has a thickness in the range of 5~300 $\mu$m, preferably 200 $\mu$m or less, and more preferably 100 $\mu$m or less. It is especially desirable to employ a foil such as copper, cupronickel, silver, iron, 42 alloy, or stainless steel that has a thickness of 36 $\mu$m or less. If this metal layer is too thick, it becomes difficult to form miniature circuit lines. Accordingly, a thickness of 300 $\mu$m or less is desirable.

Note that in the case of a metal foil attached to a resin base, in which a resin base layer is formed by coating the above-described thermosetting low dielectric resin composition to one or both surfaces of a metal layer, it is acceptable to provide a peelable protective film on top of the resin base layer. The same material as employed for the peelable film described above may be used for this protective film.

For the resin film and the metal foil attached to a resin base, the aforementioned thermosetting low dielectric resin composition may be coated to one side of the peelable film or to one or both sides of the metal layer, and then dried. In this case, the coating thickness is preferably in the range of 5~100 $\mu$m, and more preferably 10~70 $\mu$m. When the coating thickness is less than 5 $\mu$m, the insulation along the Z axis of the circuit (i.e., between circuits) is not sufficient, while when the thickness exceeds 100 $\mu$m, it is not possible to miniaturize the inner circuits.

The resin base layer in these laminates for a circuit has a cured dielectric constant that is preferably 3.2 or less, and more preferably 3.0 or less. By providing a dielectric constant that is 3.2 or less, it is possible to adequately apply the laminate to the miniaturization of the inner circuits.

The peelable film is removed, and this resin film is interposed between the metal foil employed for the outer layer circuit, and the inner layer circuit board to which a circuit has already been formed. This arrangement is then subjected to thermocompression molding to fabricate a multi-layer metal-clad laminate with inner layer circuitry. A multi-layer print circuit board can be formed by performing a step, such as etching, to the outer layer to form a specific conventionally known circuit. The metal foil attached to a resin base can be employed to form a multi-layer print circuit board by adhering it to an inner layer circuit board on which a circuit is formed, and then carrying out a step in the same manner as above to the metal layer to form a specific circuit.

In these multi-layer print circuit boards, embossing of the cloth weave does not occur and the irregularities in the inner layer circuit board are absorbed. Irregularities do not appear in the outer layer surface, and there is a high degree of surface smoothness. As a result, these multi-layer print circuit boards can be applied to forming miniaturized circuitry.

Moreover, because the resin base layer can form a film, cracking and deletion of the resin during steps such as conveying, cutting or laminating are reduced, while such problems are avoided as thinning of the intralayer insulating layer in areas where the inner layer circuit is present during thermocompression molding when the resin base is employed as an insulating material for connecting the layers in a multi-layer board. Moreover, shorts and a reduction in the insulating resistance between layers can be avoided. This design offers excellent thermal resistance, superior adherence to metals with a low dielectric constant and low dielectric dissipation factor, and very little scattering of the resin during processing operations. Further, a thinner circuit board can be achieved and a faster propagation speed for the electric signal is obtained, so that it becomes possible to process the signal more quickly.

EXAMPLES

Siloxane Denatured Polyimide Synthesis

Synthesis Example 1

16.10 g (39 millimoles) of 2,2-bis[4-(aminophenoxy) phenyl]propane, 1.25 g (5 millimoles) of 3,3'-dicarboxy-4, 4'-diaminodiphenyl methane, 21.25 g (56 millimoles) of 1,3-bis(aminophenoxymethyl)-1,1,3,3,-tetramethyldisiloxane, 32.22 g (100 millimoles) of 3,3', 4,4'-benzophenone tetracarboxylic dianhydride, and 300 ml of N-methyl-2-pyrrolidone (NMP) were placed in a flask equipped with a stirrer at a temperature below freezing, and stirred for 1 hour. The solution was then allowed to react at room temperature for 3 hours, to synthesize polyamido acid. 50 ml of toluene and 1.0 g of p-toluenesulfonic acid were added to the obtained polyamido acid, and heated to 160° C. An imidazating reaction was carried out for 3 hours as the water component was separated by boiling together with toluene. The toluene was distilled out and the obtained polyimide varnish was poured into methanol. The obtained precipitate was separated, ground, washed and dried. As a result of this process, 62.5 g (yield: 93%) of a siloxane denatured polyimide was obtained that had a molecular weight of 18,000, a Tg of 150° C., and a dielectric constant of 3.0.

The infrared absorption spectrum was measured, and typical imide absorption was confirmed at 1718, 1783 cm$^{-1}$.

Synthesis Example 2

30.34 g (74 millimoles) of 2,2-bis[4-(4-aminophenoxy) phenyl]propane, 2.35 g (8 millimoles) of 3,3'-dicarboxy-4, 4'-diaminodiphenyl methane, 13.64 g (18 millimoles) of aminopropyl terminal dimethylsiloxane octamer, 29.42 g (100 millimoles) of 2,3', 3,4', -biphenyltetracarboxylic dianhydride, and 300 ml of N-methyl-2-pyrrolidone (NMP) were employed in the same method as used in Synthesis Example 1, to obtain 67.8 g (yield: 94%) of siloxane denatured polyimide that had a molecular weight of 25,000, a Tg of 80° C., and a dielectric constant of 2.9.

The infrared absorption spectrum was measured, and typical imide absorption was confirmed at 1718, 1783 cm$^{-1}$.

Synthesis Example 3

30.34 g (74 millimoles) of 2,2-bis[4-(4-aminophenoxy) phenyl]propane, 1.12 g (4 millimoles) of 3,3'-dicarboxy-4, 4'-diaminodiphenyl methane, 6.85 g (22 millimoles) of aminopropyl terminal dimethylsiloxane octamer, 35.83 g (100 millimoles) of 3,3', 4,4', -diphenylsulfone tetracarboxylic dianhydride, and 300 ml of N-methyl-2-pyrrolidone (NMP) were employed in the same method as used in Synthesis Example 1, to obtain 75.0 g (yield: 93%) of siloxane denatured polyimide that had a molecular weight of 21,000, a Tg of 50° C., and a dielectric constant of 2.9.

The infrared absorption spectrum was measured, and typical imide absorption was confirmed at 1718, 1783 cm$^{-1}$.

Synthesis Example 4

23.55 g (81 millimoles) of 1,3-bis[3-aminophenoxy] benzene, 2.06 g (9 millimoles) of 3,3'-dihydroxy-4,4'-diaminodiphenyl methane, 8.05 g (10 millimoles) of aminopropyl terminal dimethylsiloxane octamer, 20.02 g (100 millimoles) of 3,3',4,4'-diphenylether tetracarboxylic dianhydride, and 300 ml of N-methyl-2-pyrrolidone (NMP) were employed in the same method as used in Synthesis Example 1, to obtain 45.6 g (yield: 91%) of siloxane denatured polyimide that had a molecular weight of 16,000, a Tg of 105° C., and a dielectric constant of 2.8.

The infrared absorption spectrum was measured, and typical imide absorption was confirmed at 1718, 1783 cm$^{-1}$.

Synthesis Example 5

38.37 g (74 millimoles) of 2,2-bis[4-(4-aminophenoxy) phenyl]hexafluoropropane, 1.12 g (4 millimoles) of 3,3'-dicarboxy-4,4'-diaminodiphenyl methane, 16.85 g (22 millimoles) of aminopropyl terminal dimethylsiloxane octamer, 35.83 g (100 millimoles) of 3,3', 4,4'-diphenylsulfone tetracarboxylic dianhydride, and 300 ml of N-methyl-2-pyrrolidone (NMP) were employed in the same method as used in Synthesis Example 1, to obtain 75.0 g (yield: 93%) of siloxane denatured polyimide that had a molecular weight of 20,000, a Tg of 55° C., and a dielectric constant of 2.7.

The infrared absorption spectrum was measured, and typical imide absorption was confirmed at 1718, 1783 cm$^{-1}$.

The glass transition temperature (Tg) is measured under the following conditions in the present invention.

- device: shear rate measuring device (Rheo Stress RS75, manufactured by HAAKE)
- temperature range during measurement: −10~300° C.
- rate of temperature increase: 3° C./min
- measurement frequency: 1 Hz
- distortion rate: 0.01%±0.0025%

Example Formulation of Thermosetting Low Dielectric Resin Composition

Resin Composition Formulation Example 1

100 parts by weight of the siloxane denatured polyimide resin obtained in Synthesis Example 3, 52 parts by weight of the compound expressed by chemical formula (c-2) above, and 48 parts by weight of the compound in which R in the compound expressed by chemical formula (b-1) is a methyl group (the molar equivalent of the methylallyl group with respect to one molar equivalent of the maleimide group was 1.0) were added to tetrahydrofuran, and mixed sufficiently to dissolve. As a result, a resin composition varnish was obtained that had a solid component of 30 wt %.

Resin Composition Formulation Example 2

The same operations were carried out as in Resin Composition Formulation Example 1, with the exception that the compound expressed by chemical formula (c-2) was employed in the amount of 206 parts by weight, and the compound in which R in the compound expressed by chemical formula (b-1) is a methyl group (the molar equivalent of the methylallyl group with respect to one molar equivalent of the maleimide group was 1.0) was employed in the amount of 194 parts by weight. As a result, a resin composition varnish was obtained that had a solid component of 30 wt %.

Resin Composition Formulation Example 3

The same operations were carried out as in Resin Composition Formulation Example 1, with the exception that the compound expressed by chemical formula (c-2) was employed in the amount of 464 parts by weight, and the compound in which R in the compound expressed by chemical formula (b-1) is a methyl group (the molar equivalent of the methylallyl group with respect to one molar equivalent of the maleimide group is 1.0) was employed in the amount of 436 parts by weight. As a result, a resin composition varnish was obtained that had a solid component of 30 wt %.

Resin Composition Formulation Example 4

The same operations were carried out as in Resin Composition Formulation Example 1, with the exception that the compound expressed by chemical formula (c-2) was employed in the amount of 272 parts by weight, and the compound in which R in the compound expressed by chemical formula (b-1) is a methyl group (the molar equivalent of the methylallyl group with respect to one molar equivalent of the maleimide group was 0.5) was employed in the amount of 128 parts by weight. As a result, a resin composition varnish was obtained that had a solid component of 30 wt %.

Resin Composition Formulation Example 5

The same operations were carried out as in Resin Composition Formulation Example 1, with the exception that the compound expressed by chemical formula (c-2) was employed in the amount of 166 parts by weight, and the compound in which R in the compound expressed by chemical formula (b-1) is a methyl group (the molar equivalent of the methylallyl group with respect to one molar equivalent of the maleimide group was 1.5) was employed in the amount of 234 parts by weight. As a result, a resin composition varnish was obtained that had a solid component of 30 wt %.

Resin Composition Formulation Example 6

The same operations were carried out as in Resin Composition Formulation Example 1, with the exception that the compound expressed by chemical formula (c-2) was employed in the amount of 259 parts by weight, the compound in which R in the compound expressed by chemical formula (b-1) is a methyl group was employed in the amount of 48 parts by weight, and the compound in which R in the compound expressed by chemical formula (b-2) is a methyl group was employed in the amount of 141 parts by weight (the molar equivalent of the methylallyl group with respect to one molar equivalent of the maleimide group was 1.0). As a result, a resin composition varnish was obtained that had a solid component of 30 wt %.

Resin Composition Formulation Example 7

The same operations were carried out as in Resin Composition Formulation Example 1, with the exception that the compound expressed by chemical formula (c-2) was employed in the amount of 273 parts by weight, the compound in which R in the compound expressed by chemical formula (b-1) is a methyl group was employed in the amount of 48 parts by weight, and the compound in which R in the compound expressed by chemical formula (b-2) is hydrogen was employed in the amount of 127 parts by weight (the molar equivalent of the allyl group with respect to one molar equivalent of the maleimide group was 1.0). As a result, a resin composition varnish was obtained that had a solid component of 30 wt %.

Resin Composition Formulation Example 8

The same operations were carried out as in Resin Composition Formulation Example 1, with the exception that the compound expressed by chemical formula (c-2) was employed in the amount of 215 parts by weight, and 185 parts by weight of the compound in which R is hydrogen (the molar equivalent of the allyl group with respect to one molar equivalent of the maleimide group was 1.0) were employed in place of the 48 parts by weight of the compound in which R is a methyl group in the compound expressed by chemical formula (b-1). As a result, a resin composition varnish was obtained that had a solid component of 30 wt %.

Resin Composition Formulation Example 9

The same operations were carried out as in Resin Composition Formulation Example 1, with the exception that 252 parts by weight of the compound expressed by chemical formula (c-1) were employed in place of 52 parts by weight of the compound expressed by chemical formula (c-2), and 148 parts by weight of the compound in which R is a methyl group in the compound expressed by chemical formula (b-1) (the molar equivalent of the methylallyl group with respect to one molar equivalent of the maleimide group was 1.0) were employed. As a result, a resin composition varnish was obtained that had a solid component of 30 wt %.

Resin Composition Formulation Example 10

The same operations were carried out as in Resin Composition Formulation Example 1, with the exception that 227 parts by weight of the compound expressed by chemical formula (c-3) were employed in place of 52 parts by weight of the compound expressed by chemical formula (c-2), and 173 parts by weight of the compound in which R is a methyl group in the compound expressed by chemical formula (b-1) (the molar equivalent of the methylallyl group with respect to one molar equivalent of the maleimide group was 1.0) were employed. As a result, a resin composition varnish was obtained that had a solid component of 30 wt %.

Resin Composition Formulation Example 11

The same operations were carried out as in Resin Composition Formulation Example 1, with the exception that 219 parts by weight of the compound expressed by chemical formula (c-4) where p is 1 were employed in place of 52 parts by weight of the compound expressed by chemical formula (c-2), and 181 parts by weight of the compound in which R is a methyl group in the compound expressed by chemical formula (b-1) (the molar equivalent of the methylallyl group with respect to one molar equivalent of the maleimide group was 1.0) were employed. As a result, a resin composition varnish was obtained that had a solid component of 30 wt %.

Resin Composition Formulation Example 12

The same operations were carried out as in Resin Composition Formulation Example 1, with the exception that 296 parts by weight of the compound expressed by chemical formula (c-4) where p is 8 were employed in place of 52 parts by weight of the compound expressed by chemical formula (c-2), and 104 parts by weight of the compound in which R is a methyl group in the compound expressed by chemical formula (b-1) (the molar equivalent of the methylallyl group with respect to one molar equivalent of the maleimide group was 1.0) were employed. As a result, a resin composition varnish was obtained that had a solid component of 30 wt %.

Resin Composition Formulation Example 13

The same operations were carried out as in Resin Composition Formulation Example 1, with the exception that 246 parts by weight of the compound expressed by chemical formula (c-5) were employed in place of 52 parts by weight of the compound expressed by chemical formula (c-2), and 154 parts by weight of the compound in which R is a methyl group in the compound expressed by chemical formula (b-1) (the molar equivalent of the methylallyl group with respect to one molar equivalent of the maleimide group was 1.0) were employed. As a result, a resin composition varnish was obtained that had a solid component of 30 wt %.

Resin Composition Formulation Example 14

A resin composition varnish was obtained by dispersing 150 parts by weight of a silica filler in the resin composition varnish obtained in Resin Composition Formulation Example 2.

Resin Composition Formulation Example 15

A resin composition varnish was obtained by dispersing 300 parts by weight of a silica filler in the resin composition varnish obtained in Resin Composition Formulation Example 2.

Resin Composition Formulation Example 16

A resin composition varnish was obtained through the same operations as employed in Resin Composition Formulation Example 2, with the exception that the siloxane denatured polyimide obtained in Synthesis Example 1 was employed in place of the siloxane denatured polyimide obtained in Synthesis Example 3.

Resin Composition Formulation Example 17

A resin composition varnish was obtained through the same operations as employed in Resin Composition Formulation Example 2, with the exception that the siloxane denatured polyimide obtained in Synthesis Example 2 was employed in place of the siloxane denatured polyimide obtained in Synthesis Example 3.

Resin Composition Formulation Example 18

A resin composition varnish was obtained through the same operations as employed in Resin Composition Formulation Example 2, with the exception that the siloxane denatured polyimide obtained in Synthesis Example 4 was employed in place of the siloxane denatured polyimide obtained in Synthesis Example 3.

Resin Composition Formulation Example 19

A resin composition varnish was obtained through the same operations as employed in Resin Composition Formulation Example 2, with the exception that the siloxane denatured polyimide obtained in Synthesis Example 5 was employed in place of the siloxane denatured polyimide obtained in Synthesis Example 3.

Examples 1~19

100 parts by weight of an aromatic polyester non-woven cloth (thickness: 0.1 mm, manufactured by KURARAY) was impregnated with 120 parts by weight as a solid component of the resin composition varnishes obtained in the preceding Resin Composition Formulation Examples 1~19. The impregnated cloth was then dried for 5 minutes in a dryer at 140° C., thereby fabricating 19 different types of prepregs.

The obtained prepregs were tack-free and pliable, and had excellent workability.

Four prepregs were stacked on top of one another, and 18 $\mu$m thick copper foil was disposed to the outermost surfaces of the top and bottom of this prepreg stack. Molding was then carried out at a pressure of 20 kg/cm$^2$ and a temperature of 200° C. for 2 hours. As a result, a 0.4 mm thick laminate was obtained that had copper cladding on both surfaces thereof.

Example 20

A 0.4 mm thick laminate with copper cladding on both surfaces was obtained by performing the same operations as employed in Example 1, with the exception that an aramid non-woven cloth (thickness: 0.1 mm, manufactured by E.I. du Pont de Nemours and Company) was used in place of the aromatic polyester non-woven cloth.

Example 21

A 0.4 mm thick laminate with copper cladding on both surfaces was obtained by performing the same operations as employed in Example 1, with the exception that a tetrafluro-carbon non-woven cloth (thickness: 0.1 mm, manufactured by Tomoegawa Paper Co., Ltd.) was used in place of the aromatic polyester non-woven cloth.

Example 22

A 0.4 mm thick laminate with metal cladding on both surfaces was obtained by performing the same operations as employed in Example 1, with the exception that 18 $\mu$m thick 42 alloy foil was employed in place of the 18 $\mu$m thick copper foil.

Comparative Example 1

100 parts by weight of the siloxane denatured polyimide resin obtained in Synthesis Example 3 and 400 parts by weight of the compound indicated by the preceding chemical formula (c-2) were added to tetrahydrofuran, and mixed adequately to dissolve, thereby formulating a resin composition with solid component of 30 wt %.

Using this resin composition varnish, the same operations were performed as in Example 1, to obtain a 0.4 mm thick laminate with copper cladding on both surfaces thereof.

Comparative Example 2

A resin composition varnish was formulated through the same operations as employed in Resin Composition Formulation Example 1, with the exception that an acrylonitrile butadiene copolymer was used in place of the siloxane denatured polyimide obtained in Synthesis Example 3.

Using this resin composition varnish, the same operations were performed as in Example 1, to obtain a 0.4 mm thick laminate with copper cladding on both surfaces thereof.

Comparative Example 3

A siloxane denatured polyimide having a molecular weight of 10,000, a Tg of 60° C. and a dielectric constant of 2.9 was synthesized from 32.74 g (80 millimoles) of 2,2-bis[4-(4-aminophenoxy)phenyl]propane; 15.54 g (20 millimoles) of a diaminosiloxane expressed by chemical formula (5) where Q=NH$_2$, R=propylene, and n=8; 29.42 g (100 millimoles) of 2,3',3,4'-biphenyltetracarboxylic dianhydride; and 300 ml of NMP.

A resin composition varnish was formulated through the same operations as employed in Resin Composition Formulation Example 9, with the exception that this siloxane denatured polyimide was used in place of the siloxane denatured polyimide obtained in Synthesis Example 3.

Using this resin composition varnish, the same operations were performed as in Example 1, to obtain a 0.4 mm thick laminate with copper cladding on both surfaces thereof.

Evaluation

The dielectric constant, peel strength, solder thermal resistance, and electrical reliability in a PCBT were measured and evaluated for the laminates obtained in each of the preceding Examples 1~22 and Comparative Examples 1~3.

Dielectric Constant

The capacitance of the cured resin layer was measured according to Japan Industrial Standard (JIS) C6481 (dielectric constant and dielectric dissipation factor). Namely, the resistance of a laminate that had been worked (including etching) into a specific shape was measured using a bridge circuit. The frequency was 1 MHz. Note that this measurement may also be performed using the distance variation method, which is a type of bridge method.

Peel Strength

Peel strength was measured in accordance with JIS C6481 (peel strength). Namely, a test member was formed by removing the metal foil on either side of the laminates except for a 10 ×100 mm portion of the metal foil. Gripping one edge of the metal foil on this test member, a 50 mm portion of the metal foil was peeled at an angle 90° C. and a rate of 50 mm/min. The peel strength was defined as the minimum value of the load in this case.

Solder Thermal Resistance

Solder thermal resistance was measured according to JIS C6481 (solder thermal resistance). Namely, each laminate was cut into 25×25 mm dimensions, to form a test piece. The test pieces were soaked for 20 seconds in a soldering solution, and an external examination for abnormalities at 260° C. was made.

PCBT (Pressure Cooker Bias Test)

Etching was employed to form a pattern of line intervals at 100 μm to the surface of the laminate. A 0.1 mm thick prepreg was laminated on top of this pattern, and a test member was formed by performing thermocompression molding for 2 hours at a temperature of 200° C. and a pressure of 20 kg/cm$^2$.

An examination was then made for the presence of shorts in the pattern when the test member was impressed at a voltage of 5V, at 121° C., 2 atmospheric pressures, and 100% RH for 1000 hours.

TABLE 1

| | characteristics | | | |
|---|---|---|---|---|
| | dielectric constant | peel strength (kg/10 mm) | solder thermal resistance | PCBT |
| Example 1 | 3.0 | 1.5 | no problem | no short circuit |
| Example 2 | 2.9 | 1.5 | no problem | no short circuit |
| Example 3 | 3.1 | 1.6 | no problem | no short circuit |
| Example 4 | 3.0 | 1.6 | no problem | no short circuit |
| Example 5 | 3.0 | 1.5 | no problem | no short circuit |
| Example 6 | 3.0 | 1.7 | no problem | no short circuit |
| Example 7 | 3.1 | 1.6 | no problem | no short circuit |
| Example 8 | 2.9 | 1.5 | no problem | no short circuit |
| Example 9 | 3.2 | 1.6 | no problem | no short circuit |
| Example 10 | 3.1 | 1.5 | no problem | no short circuit |
| Example 11 | 3.1 | 1.5 | no problem | no short circuit |
| Example 12 | 3.0 | 1.7 | no problem | no short circuit |
| Example 13 | 2.9 | 1.7 | no problem | no short circuit |
| Example 14 | 3.0 | 1.6 | no problem | no short circuit |
| Example 15 | 3.0 | 1.5 | no problem | no short circuit |
| Example 16 | 3.1 | 1.6 | no problem | no short circuit |
| Example 17 | 2.9 | 1.7 | no problem | no short circuit |
| Example 18 | 3.2 | 1.5 | no problem | no short circuit |
| Example 19 | 3.0 | 1.5 | no problem | no short circuit |
| Example 20 | 3.0 | 1.5 | no problem | no short circuit |
| Example 21 | 2.9 | 1.6 | no problem | no short circuit |
| Example 22 | 3.2 | 1.5 | no problem | no short circuit |
| Comparative Example 1 | 3.4 | 1.7 | copper foil swollen | no short circuit |
| Comparative Example 2 | 3.6 | 1.5 | no problem | no short circuit |
| Comparative Example 3 | 3.2 | 1.0 | no problem | no short circuit |

From Table 1, it may be understood that the laminates according to the present embodiments demonstrated a low dielectric constant, high adhesive strength, and high thermal resistance. Further, these laminates demonstrated a high degree of electrical reliability with no short circuits in the PCBT. In contrast, in the laminate of Comparative Example 1, consisting of a resin composition that did not include the present invention's component (b), the copper foil blistered and the laminate demonstrated low thermal resistance. In the case of the laminate according to Comparative Example 2, consisting of a resin composition that did not include a siloxane denatured polyimide, the dielectric constant was large so that the targeted application was not possible. Finally, the laminate according to Comparative Example 3, consisting of a resin composition that did not include component (2c) satisfying Ar in accordance with the present invention, had a low peel strength and inferior adhesive strength.

Examples 23~41

Each of the resin composition varnishes obtained in Resin Composition Formulation Examples 1~19 were coated to one side of a 18 μm thick copper foil so that the dried resin base layer would have a thickness of 60 µm. The arrangement was then subjected to drying in a warm air circulating dryer at 140° C. for 5 minutes, to form a copper foil attached to a resin base.

Next, the obtained copper foils attached to a resin base were stacked on either side of an inner layer circuit board, to which specific circuits had been formed in advance to both sides of a laminate board that was clad with 18 µm thick copper foil on each surface and had a 0.1 mm thick insulating layer. The copper foil attached to a resin base was stacked so that its resin surface was directed toward the inner layer circuit. This arrangement was then subjected to molding at a pressure of 20 kg/cm$^2$ and a temperature of 200° C. for 2 hours, to form a multi-layer copper-clad laminate with inner layer circuitry.

Example 42

With the exception that the resin obtained in Resin Composition Formulation Example 2 was employed, and an 18 µm thick 42 alloy foil was used in place of the 18 µm thick copper foil, the same operations were carried out as in Example 24 to produce a multi-layer copper-clad laminate with inner layer circuitry.

Example 43

The resin composition varnish obtained in Resin Composition Formulation 2 was coated to one side of a 38 µm thick polyethylene terephthalate film (peelable film) which had been peel-treated, so that the thickness of the dried resin base layer would have a thickness of 60 µm. This arrangement was then dried for 5 minutes at 140° C. in a warm air circulating dryer, to form a resin film.

Next, the obtained resin films were stacked on top of an inner layer circuit on either side of an inner layer circuit board, to which specific circuits had been formed in advance to both sides of a laminate board that was clad with 18 µm thick copper foil on each surface and had a 0.1 mm thick insulating layer. The peelable film was removed and an 18 µm thick copper foil was stacked on the arrangement. This arrangement was then subjected to molding at a pressure of 20 kg/cm$^2$ and a temperature of 200° C. for 2 hours, to form a multi-layer copper-clad laminate with inner layer circuitry.

Comparative Example 4

A multi-layer copper-clad laminate with inner layer circuitry was formed through the same operations as used in Example 23, with the exception that a resin composition with a solid component of 30 wt % was employed that was obtained by adding 100 parts by weight of the siloxane denatured polyimide resin obtained in Synthesis Example 3 and 400 parts by weight of the compound indicated by the preceding chemical formula (c-2) to tetrahydrofuran, and mixing adequately to dissolve.

Comparative Example 5

A resin composition varnish was formulated through the same operation as used in Resin Composition Formulation Example 1, with the exception that an acrylonitrile butadiene copolymer was employed in place of the siloxane denatured polyimide. The obtained resin composition varnish was used to form a multi-layer copper-clad laminate with inner layer circuitry through the same operations as used in Example 23.

Comparative Example 6

A resin composition varnish was formulated through the same operation as used in Resin Composition Formulation Example 1, with the exception that in place of the siloxane denatured polyimide, a siloxane denatured polyimide was employed that had a molecular weight of 10,000, a Tg of 60° C. and a dielectric constant of 2.9, and was synthesized from 32.74 g (80 millimoles) of 2,2-bis[4-(4-aminophenoxy) phenyl]propane; 15.54 g (20 millimoles) of a dimethylsiloxane expressed by chemical formula (5) where Q=NH$_2$, R=propyl, and n=8; 29.42 g (100 millimoles) of 2,3',3,4'-biphenyltetracarboxylic dianhydride; and 300 ml of NMP.

Using the obtained resin composition varnish, the same operations were performed as in Example 23, to obtain a 0.4 mm thick laminate having copper cladding on both surfaces thereof.

Evaluation

The dielectric constant, peel strength, solder thermal resistance, scattering and electrical reliability based on the PCBT were measured and evaluated for the laminates obtained in each of the preceding Examples 23–43 and Comparative Examples 4–6.

The dielectric constant, peel strength, solder thermal resistance, and PCBT were measured using the same methods as described above.

Scattering

A visual observation was made to determine whether or not the resin scattered near cutting sites when cut with a cutter knife, and the presence of flash was evaluated. This was carried out resin which had not been cured yet.

TABLE 2

| | characteristics | | | | |
|---|---|---|---|---|---|
| | dielectric constant | peel strength (kg/ 10 mm) | solder thermal resistance | scattering | PCBT |
| Example 23 | 2.9 | 1.5 | no problem | no flash | no short circuit |
| Example 24 | 2.7 | 1.5 | no problem | no flash | no short circuit |
| Example 25 | 2.9 | 1.6 | no problem | no flash | no short circuit |
| Example 26 | 2.9 | 1.6 | no problem | no flash | no short circuit |
| Example 27 | 2.9 | 1.5 | no problem | no flash | no short circuit |
| Example 28 | 2.8 | 1.7 | no problem | no flash | no short circuit |
| Example 29 | 3.0 | 1.6 | no problem | no flash | no short circuit |
| Example 30 | 2.8 | 1.5 | no problem | no flash | no short circuit |
| Example 31 | 3.0 | 1.6 | no problem | no flash | no short circuit |
| Example 32 | 2.9 | 1.5 | no problem | no flash | no short circuit |
| Example 33 | 2.8 | 1.5 | no problem | no flash | no short circuit |
| Example 34 | 2.9 | 1.7 | no problem | no flash | no short circuit |
| Example 35 | 2.8 | 1.7 | no problem | no flash | no short circuit |
| Example 36 | 2.7 | 1.6 | no problem | no flash | no short circuit |
| Example 37 | 2.9 | 1.5 | no problem | no flash | no short circuit |
| Example 38 | 3.0 | 1.6 | no problem | no flash | no short circuit |
| Example 39 | 2.8 | 1.7 | no problem | no flash | no short circuit |

TABLE 2-continued

| | characteristics | | | | |
|---|---|---|---|---|---|
| | dielectric constant | peel strength (kg/ 10 mm) | solder thermal resistance | scattering | PCBT |
| Example 40 | 3.0 | 1.5 | no problem | no flash | no short circuit |
| Example 41 | 2.8 | 1.5 | no problem | no flash | no short circuit |
| Example 42 | 2.7 | 1.5 | no problem | no flash | no short circuit |
| Example 43 | 2.7 | 1.6 | no problem | no flash | no short circuit |
| Comparative Example 4 | 3.4 | 1.6 | copper foil swollen | no flash | no short circuit |
| Comparative Example 5 | 3.6 | 1.6 | no problem | no flash | no short circuit |
| Comparative Example 6 | 3.0 | 1.1 | no problem | no flash | no short circuit |

From Table 2, it may be understood that the laminates for circuits according to the present embodiments demonstrated a low dielectric constant, high adhesive strength, and high thermal resistance. Further, these circuit laminates demonstrated a high degree of electrical reliability with no short circuits in the PCBT. In addition, these resins were easy to handle, with no cracking or scattering of the resin near cutting sites when cutting the resin with a cutter knife.

In contrast, in the laminate of Comparative Example 4, which employed a resin composition that did not include the present invention's component (b), the copper foil blistered and the laminate demonstrated low thermal resistance. In the case of the laminate according to Comparative Example 5, which employed a resin composition that did not include a siloxane denatured polyimide, the dielectric constant was large so that the targeted application was not possible. Finally, the laminate according to Comparative Example 6, which employed a resin composition that did not include component (2c) satisfying $Ar^2$ in accordance with the present invention, had a low peel strength and inferior adhesive strength.

Industrial Applicability

The present invention's thermosetting low dielectric resin composition has a low dielectric constant, excellent thermal resistance and workability, and can form a film. Accordingly, prepregs, laminates and laminates for circuits employing this resin composition demonstrate sufficient peel strength at room temperature, and, in particular, can be desirably employed as laminates for printed circuit boards.

Accordingly, by employing the present invention's prepregs, laminates and laminates for circuits as printed circuit boards, it is possible to increase the speed at which electric signals are propagated. As a result, signals can be processed at a higher speed. In addition, these prepregs, laminates and laminates for circuits are applicable to the formation of miniaturized circuits lines, and can be suitably employed in electronic devices that are employed in the high frequency region, and in particular, in electronic devices that must be made smaller and lighter in weight.

What is claimed is:

1. A thermosetting low dielectric resin composition comprising a component (a), which is a siloxane denatured polyimide comprising a structural unit expressed by the following formula (2a), a structural unit expressed by the following formula (2b), and a structural unit expressed by the following formula (2c).

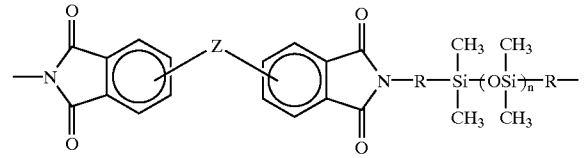

(2a)

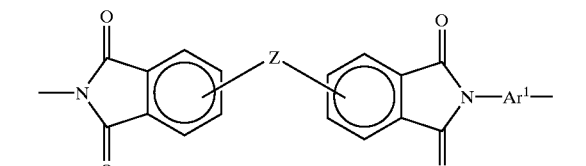

(2b)

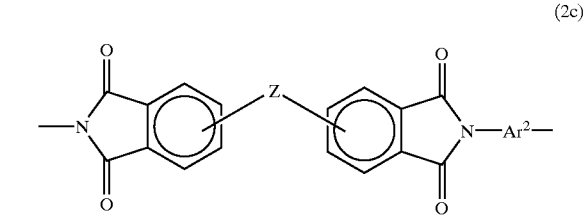

(2c)

where, in the above formulae, Z indicates a direct coupling, or a —O—, —SO2—, —CO—, —C(CH$_3$)$_2$—, —C(CF$_3$)$_2$—, or —COOCH$_2$CH$_2$OCO—bond; $Ar^1$ indicates a bivalent group having an aromatic ring; $Ar^2$ indicates a bivalent organic group having one or two hydroxyl groups or carboxyl groups; R indicates a 1~10 C alkylene or —CH$_2$OC$_6$H$_8$— of which the methylene group is bonded to Si; and n is an integer between 1~20;

a component (b), which is a compound expressed by the following formula (b-1) or the following formula (b-2):

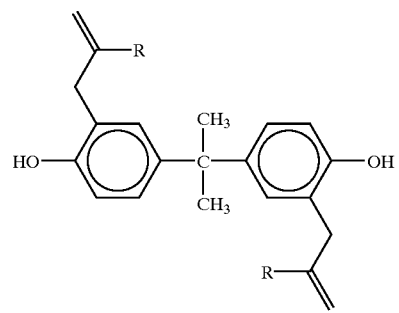

(b-1)

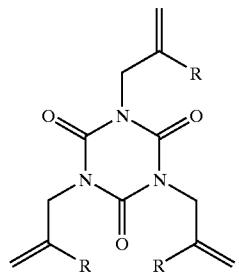

(b-2)

and where, R in the above formulas (b-1) and (b-2) indicates a hydrogen atom or a methyl group and a component (c), which is a compound having two or more maleimide groups.

2. A thermosetting low dielectric resin composition according to claim 1, wherein the total of component (b) and component (c) is in the range of 10~900 parts by weight with respect to 100 parts by weight of said component (a), and the allyl group or methylallyl group of component (b) is present in the amount of 0.1~2.0 molar equivalents with respect to 1 molar equivalent of the maleimide group in component (c).

3. A thermosetting low dielectric resin composition according to claim 1, where, in the siloxane denatured polyimide of said component (a), the proportion of the structural unit expressed by chemical formula (2a), and the total of the structural units expressed by chemical formulae (2b) and (2c) is in a molar ratio range of 5~60:95~40, and the proportion of the structural unit expressed by formula (2b) and the structural unit expressed by formula (2c) is in a molar ratio range of 1~99:99~1.

4. A thermosetting low dielectric resin composition according to claim 1, wherein $Ar^1$ is selected from the group consisting of the following chemical formula:

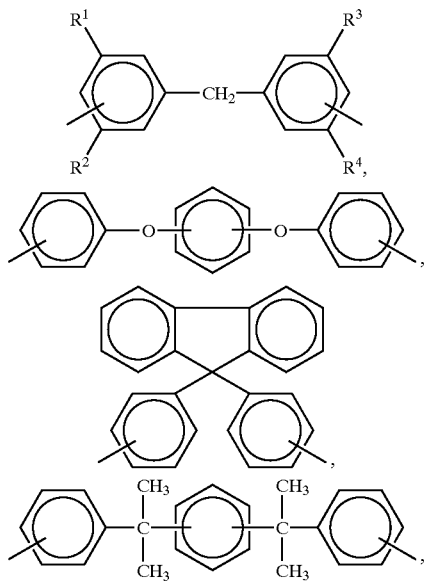

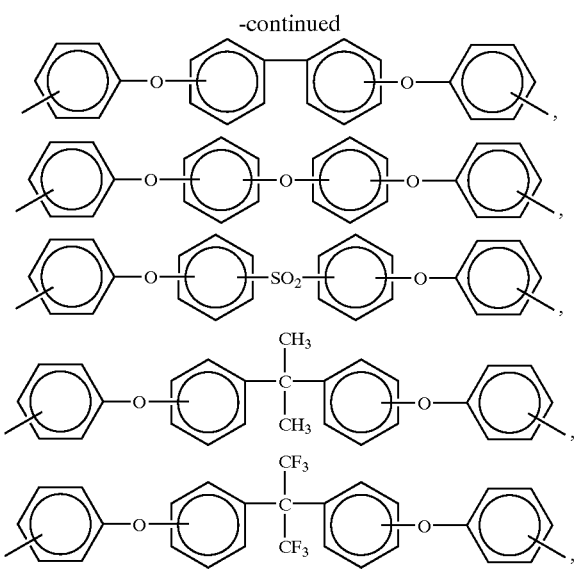

wherein $R^1$, $R^2$, $R^3$, and $R^4$ may be the same or different, wherein $R^1$, $R^2$, $R^3$, and $R^4$ may indicate a hydrogen atom, a 1~4 C alkyl group, or a 1~4 C alkoxy group, and wherein all of $R^1$, $R^2$, $R^3$, and $R^4$ may not simultaneously be hydrogen atoms.

5. A thermosetting low dielectric resin composition according to claim 1, wherein the glass transition temperature of the siloxane denatured polyimide of said component (a) is 150° C. or less.

6. A thermosetting low dielectric resin composition according to claim 1, wherein the weight average molecular weight of the siloxane denatured polyimide of said component (a) is in the range of 5,000~500,000.

7. A thermosetting low dielectric resin composition according to claim 1, wherein the dielectric constant of the siloxane denatured polyimide of said component (a) is 3.0 or less.

8. A thermosetting low dielectric resin composition according to claim 1, wherein the compound containing two or more maleimide groups of said component (c) is selected from the group of compounds represented by the following formulae:

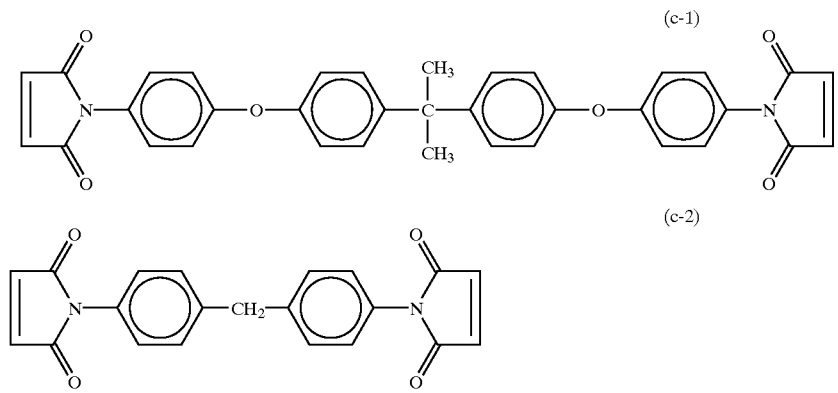

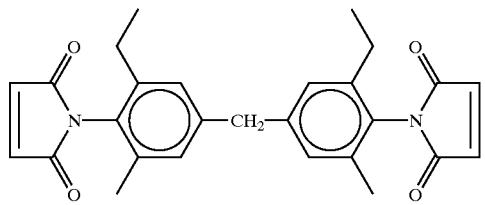

(c-3)

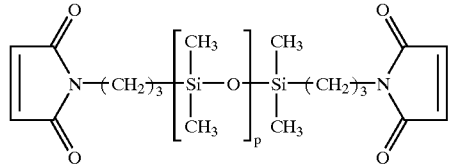

(c-4)

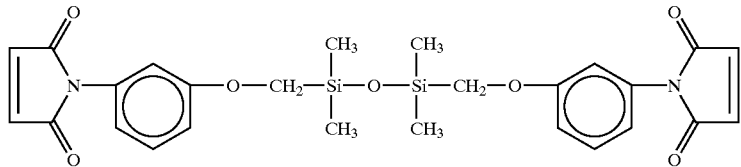

(c-5)

where p in formula (c-4) indicates an integer from 1~8.

9. A thermosetting low dielectric resin composition according to claim 1, wherein the dielectric constant in the cured state is 3.2 or less.

10. A prepreg containing a fiber material and the thermosetting low dielectric resin composition according to claim 1.

11. A prepreg according to claim 10, wherein said fiber material is a woven or non-woven cloth consisting of either aramid fiber, aromatic polyester fiber, or tetrafluorocarbon fiber.

12. A laminate, wherein a plurality of the prepregs according to claim 10 are laminated together.

13. A laminate according to claim 12, wherein the thermosetting low dielectric resin composition of the laminate is in the cured state.

14. A laminate wherein a metal layer is formed to one or both surfaces of the laminate according to claim 12.

15. A laminate for a circuit, containing a peelable film and a resin base layer consisting of the thermosetting low dielectric resin composition according to claim 1.

16. A laminate for a circuit, containing a metal layer and a resin base layer consisting of the thermosetting low dielectric resin composition according to claim 1.

17. A laminate for a circuit according to claim 15, wherein said peelable film is directly formed to the resin base layer.

18. A laminate for a circuit according to claim 16, wherein the thickness of said metal layer is in the range of 5~300 μm.

* * * * *